(12) United States Patent
Ito et al.

(10) Patent No.: US 10,355,040 B2
(45) Date of Patent: Jul. 16, 2019

(54) PHOTOELECTRIC CONVERSION DEVICE

(71) Applicant: SHARP KABUSHIKI KAISHA, Sakai, Osaka (JP)

(72) Inventors: Kazuatsu Ito, Sakai (JP); Seiji Kaneko, Sakai (JP); Yohsuke Kanzaki, Sakai (JP); Takao Saitoh, Sakai (JP); Tadayoshi Miyamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/770,742

(22) PCT Filed: Feb. 22, 2017

(86) PCT No.: PCT/JP2017/006549
§ 371 (c)(1),
(2) Date: Apr. 24, 2018

(87) PCT Pub. No.: WO2017/150295
PCT Pub. Date: Sep. 8, 2017

(65) Prior Publication Data
US 2018/0301495 A1 Oct. 18, 2018

(30) Foreign Application Priority Data
Feb. 29, 2016 (JP) .................................. 2016-037797

(51) Int. Cl.
*H01L 31/10* (2006.01)
*H01L 27/146* (2006.01)
(Continued)

(52) U.S. Cl.
CPC ...... *H01L 27/14636* (2013.01); *H01L 27/146* (2013.01); *H01L 27/14612* (2013.01);
(Continued)

(58) Field of Classification Search
CPC ............ H01L 27/24636; H01L 31/105; H01L 27/14636; H01L 29/7869; H01L 29/786;
(Continued)

(56) References Cited

U.S. PATENT DOCUMENTS 6,437,341 B1    8/2002   Izumi et al.
8,044,445 B2 * 10/2011   Hayashi ............ H01L 27/14603
                                                            257/288
(Continued)

FOREIGN PATENT DOCUMENTS

JP      H11-97660 A      4/1999
JP      2001-135809 A      5/2001
(Continued)

*Primary Examiner* — Alexander O Williams
(74) *Attorney, Agent, or Firm* — ScienBiziP, P.C.

(57) ABSTRACT

An off-leakage current of a photodiode is reduced in a photoelectric conversion device. A photoelectric conversion device (100) includes: an oxide semiconductor layer (5) provided on a substrate (1); a passivation film (6) and a planarizing film (7) which are stacked on the oxide semiconductor layer; and a photodiode (9) including a lower electrode (91), a photoelectric conversion layer (92), and an upper electrode (93). The lower electrode is connected to a source electrode (4) via a contact hole provided in the passivation film and the planarizing film. No photoelectric conversion layer is provided directly above the contact hole.

4 Claims, 5 Drawing Sheets

(51) Int. Cl.
*H01L 29/786* (2006.01)
*H01L 31/105* (2006.01)

(52) U.S. Cl.
CPC .. *H01L 27/14658* (2013.01); *H01L 27/14692* (2013.01); *H01L 29/786* (2013.01); *H01L 31/10* (2013.01); *H01L 29/7869* (2013.01); *H01L 31/105* (2013.01)

(58) Field of Classification Search
CPC . H01L 27/146; H01L 31/10; H01L 27/14612; H01L 27/14658; H01L 27/14692
USPC ........................................................ 257/290
See application file for complete search history.

(56) References Cited

U.S. PATENT DOCUMENTS

| | | | |
|---|---|---|---|
| 9,184,297 B2* | 11/2015 | Koezuka | H01L 29/66742 |
| 9,450,133 B2* | 9/2016 | Nakamura | H01L 31/1055 |
| 2010/0059804 A1 | 3/2010 | Hayashi et al. | |
| 2014/0103347 A1 | 4/2014 | Ishino | |
| 2016/0322416 A1* | 11/2016 | Nara | H01L 27/14643 |
| 2017/0250214 A1* | 8/2017 | Sekine | H01L 27/14616 |
| 2018/0122842 A1* | 5/2018 | Saitoh | G01T 1/20 |

FOREIGN PATENT DOCUMENTS

| | | |
|---|---|---|
| JP | 2010-67762 A | 3/2010 |
| JP | 2014-78651 A | 5/2014 |

\* cited by examiner

PHOTOELECTRIC CONVERSION DEVICE

TECHNICAL FIELD

The present invention relates to a photoelectric conversion device.

BACKGROUND ART

Conventionally, photoelectric conversion devices have been utilized as X-ray sensors and optical sensors. Patent Literature 1 discloses an example of such a photoelectric conversion device.

CITATION LIST

Patent Literature

[Patent Literature 1]
Japanese Patent Application Publication No. Tokukai 2010-67762 (Publication date: Mar. 25, 2010)

SUMMARY OF INVENTION

Technical Problem

FIG. 7 is a sectional view illustrating an example of a photoelectric conversion device in accordance with a conventional technique. In a photoelectric conversion device 110, a contact hole is secured directly below a photodiode 9, which is a PIN diode (see FIG. 7). A source electrode 4 of an oxide semiconductor layer 5 (i.e., thin film transistor) and a lower electrode 91 of the photodiode 9 are connected via the contact hole. The photoelectric conversion device with such a structure has a problem that an off-leakage current of the photodiode 9 becomes large.

The following description will discuss a cause of the above problem with reference to FIGS. 8 and 9. FIG. 8 is an enlarged sectional view illustrating an example of a photodiode in accordance with the conventional technique. FIG. 9 is a graph illustrating an example property of the photodiode in accordance with the conventional technique. In an inclined part of a lower electrode 91, a photoelectric conversion layer 92 is thinner as compared with a flat part of the lower electrode 91 (see FIG. 8). This causes (i) an n+ layer 921 of the photoelectric conversion layer 92 to be easy to break and (ii) a crack to occur in an i layer 922 of the photoelectric conversion layer 92. This results in an increase in electric current due to a reverse bias voltage across a photodiode 9, and ultimately causes an increase in off-leakage current of the photodiode 9 (see FIG. 9).

The present invention as attained in view of the above problem, and an object of the present invention is to reduce an off-leakage current of a photodiode in a photoelectric conversion device.

Solution to Problem

In order to attain the above object, a photoelectric conversion device in accordance with an aspect of the present invention includes: a substrate; a thin film transistor provided on the substrate; a first insulating layer stacked on the thin film transistor; and a photodiode including an upper electrode, a lower electrode, and a photoelectric conversion layer which is provided between the upper electrode and the lower electrode, the lower electrode of the photodiode being connected to a drain electrode of the thin film transistor, via a first contact hole secured in the first insulating layer, no photoelectric conversion layer being provided directly above the first contact hole.

Advantageous Effects of Invention

An aspect of the present invention brings about an effect of reducing an off-leakage current of a photodiode in a photoelectric conversion device.

DESCRIPTION OF EMBODIMENTS

Embodiment 1

The following description will discuss, in detail, Embodiment 1 of the present invention with reference to FIGS. 1 through 4.

Figure 1:
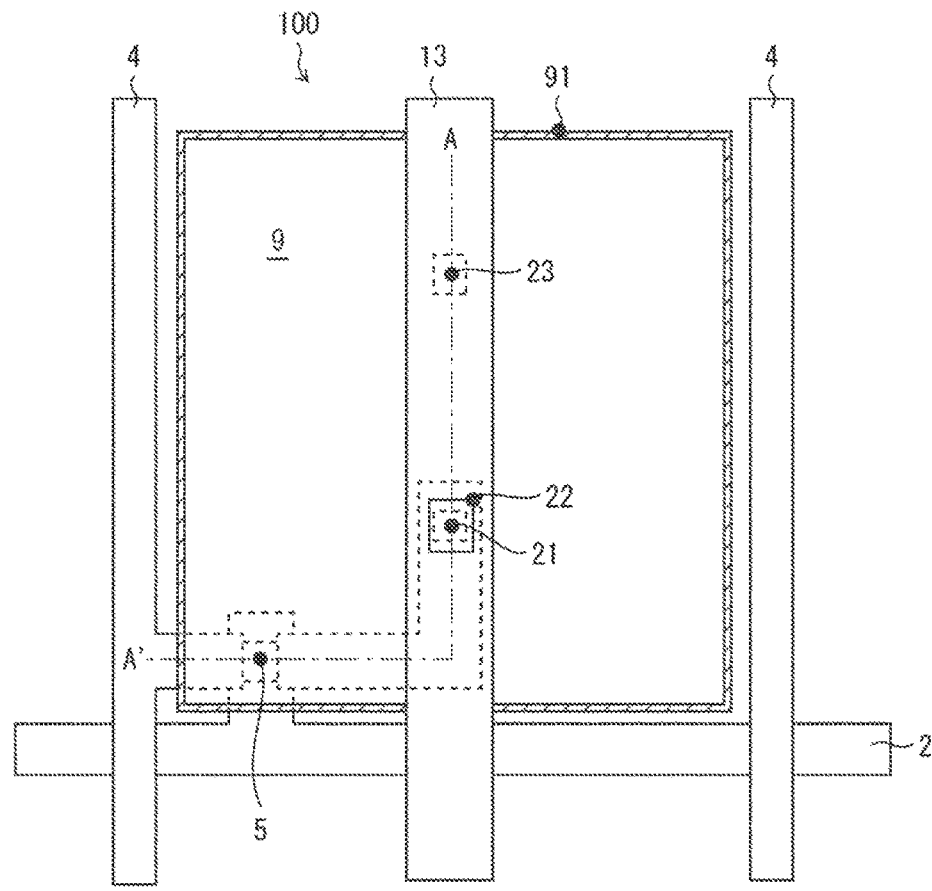
FIG. 1 is a plan view illustrating a configuration of an array substrate for use in a photoelectric conversion device in accordance with Embodiment 1 of the present invention.

FIG. 1 is a plan view illustrating a configuration of an array substrate for use in a photoelectric conversion device 100 in accordance with Embodiment 1. As illustrated in FIG. 1, there are provided a plurality of gate electrodes 2 and a plurality of source electrodes (drain electrodes) 4. The plurality of gate electrodes 2 are provided so as to be parallel to each other, and the plurality source electrodes 4 are provided so as to be parallel to each other. Each of the plurality of gate electrodes 2 is provided so as to extend in a lateral direction, and each of the plurality of source electrodes 4 is provided so as to extend in a longitudinal direction. The plurality of gate electrodes 2 and the plurality of source electrodes 4 intersect with each other, via a gate insulating film 3 (not illustrated in FIG. 1, see FIG. 2).

An oxide semiconductor layer 5 is provided directly above the gate electrode 2. A photodiode 9, which is a PIN diode, is provided so as to be located (i) between adjacent source electrodes 4 and (ii) above the oxide semiconductor layer 5. The photodiode 9 includes a lower electrode 91.

A source electrode 13 is provided so as to extend above the photodiode 9. The source electrode 13 is provided between adjacent source electrodes 4 of the oxide semiconductor layer 5 (particularly, in a center of adjacent source electrodes 4). The source electrode 13 and the source electrode 4 are provided so as to be substantially parallel to each other.

A contact hole is an opening, secured in an insulating film, via which (i) a layer in which an element is provided is connected to a layer for wiring. There is provided a contact hole (first contact hole) 21 via which the lower electrode 91 is connected to the source electrode 4. There is secured a void 22 in which a photoelectric conversion layer 92 of the photodiode 9 is not provided. There is secured a contact hole (second contact hole) 23 via which an upper electrode of the photodiode 9 is connected to the source electrode 13. In the photoelectric conversion device 100, the contact holes 21 and 23 are secured in an interior of the photodiode 9 (i.e., in the vicinity of a center part of the photodiode 9). There is secured the contact hole 21 in the center of the adjacent source electrodes 4 of the oxide semiconductor layer 5.

Figure 2:
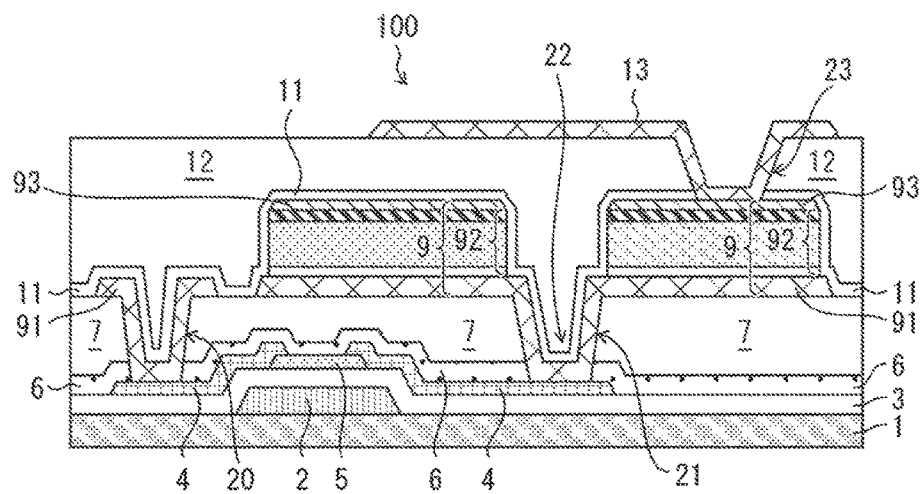
FIG. 2 is a sectional view taken along a line A-A' in FIG. 1.

FIG. 2 is a sectional view taken along a line A-A' in FIG. 1. As illustrated in FIG. 2, a photoelectric conversion device 100 includes a substrate 1, a gate electrode 2, a gate insulating film a source electrode 4, an oxide semiconductor layer 5, a passivation film (first insulating layer) 6, a planarizing film (first insulating aver a photodiode 9, an SiNx insulating film (second insulating layer) 11, a planarizing film (second insulating layer) 12, and a source electrode 13. The photodiode 9 includes a lower electrode 91, a photoelectric conversion layer 92, and an upper electrode 93.

The substrate 1 is a transparent insulating glass substrate. The gate electrode 2 is provided on the substrate 1. The gate insulating film 3 is provided on the substrate 1 and the gate electrode 2. The source electrode 4 is provided on the gate insulating film 3. The gate insulating film 3 has a contact hole (not illustrated), via which the gate electrode 2 is connected to the source electrode 4.

The oxide semiconductor layer 5, which is a thin film transistor, is provided above the substrate 1, specifically directly above the gate electrode 2 via the gate insulating film 3. The passivation film 6 and the planarizing film 7 are stacked on the oxide semiconductor layer 5. Specifically, the passivation film 6 is provided on the gate insulating film 3, the source electrode 4, and the oxide semiconductor layer 5. The planarizing film 7 is provided on the passivation film 6 thus provided.

The lower electrode 91 of the photodiode 9 is connected to the source electrode 4 of the oxide semiconductor layer 5, via contact holes 20 and 21 each of which is secured in the passivation film 6 and the planarizing film 7.

The photodiode 9 employs a structure in which the photoelectric conversion layer 92 is provided between the upper electrode 93 and the lower electrode 91. The lower electrode 91 is provided on the source electrode 4 which is exposed in the contact holes 20 and 21. The photoelectric conversion layer 92 is provided on the lower electrode 91. The upper electrode 93, which is an IZO electrode, is provided on the photoelectric conversion layer 92.

The SiNx insulating film 11 and the planarizing film 12 are stacked on the photodiode 9. More specifically, the SiNx insulating film 11 is continuously provided on the lower electrode 91 and the upper electrode 93. The planarizing film 12 is provided on the SiNx insulating film 11 thus provided.

The upper electrode 93 of the photodiode 9 is connected to the source electrode 13 of the photodiode 9, via a contact hole 23 which is secured in the SiNx insulating film 11 and the planarizing film 12. The source electrode 13 is provided on the upper electrode 93 which is exposed in the contact hole 23. In other words, the contact hole 23 is provided directly below the source electrode 13.

Figure 3:
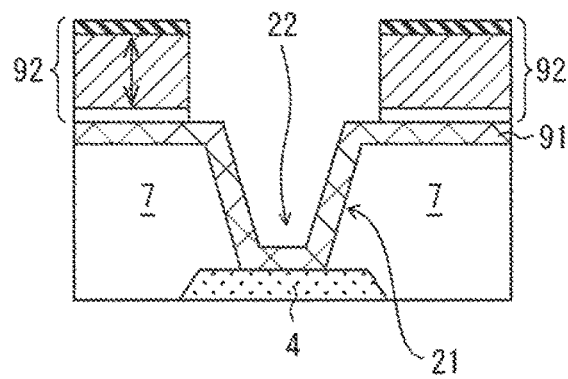
FIG. 3 is an enlarged view of FIG. 2.

FIG. 3 is an enlarged view of FIG. 2. As is clear from FIG. 3, there is not provided, directly above the contact hole 21, any photoelectric conversion layer of the photodiode 9. This causes a void 22 to be secured. That is, as is clear from FIG. 3, there is no inclined section of a photoelectric conversion layer 92 in accordance with a conventional technique (see FIG. 8). As such, there is no part where the photoelectric conversion layer 92 is thinner as compared with a flat part. This prevents an increase in electric current due to a reverse bias voltage.

Figure 4:
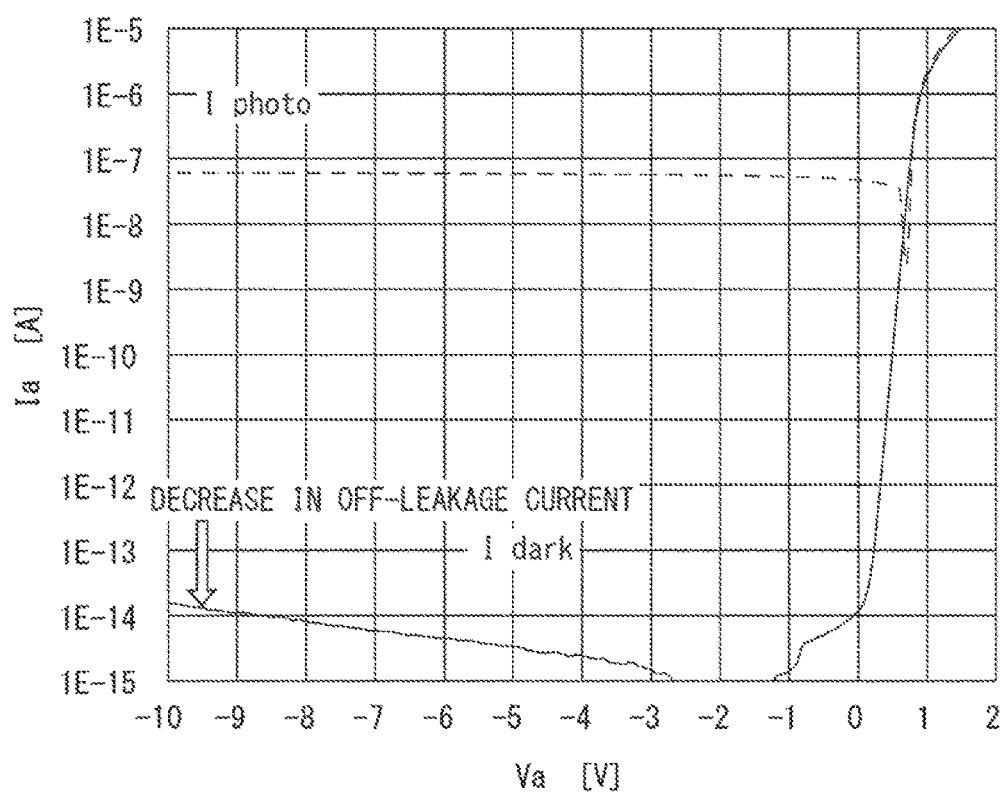
FIG. 4 is a graph illustrating an example property of a photodiode in accordance with Embodiment 1 of the present invention.

FIG. 4 is a graph illustrating an example property of the photodiode 9 in accordance with Embodiment 1. In FIG. 4, (i) a lateral axis Va indicates a voltage applied across the lower electrode 91 of and across the upper electrode 93 of the photodiode 9 and a longitudinal axis Ia indicates an electric current flowing through the photodiode 9. "I photo" indicates an example property characterized in a case where the photodiode 9 is irradiated with light having a given illuminance (e.g., 2000 [lx]). "I dark" indicates an example property characterized in a case where the photodiode 9 is not irradiated with any light.

Figure 8:
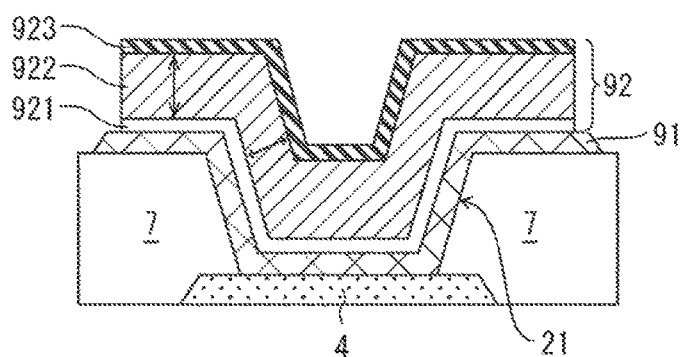
FIG. 8 is an enlarged view of FIG. 7.
Figure 9:
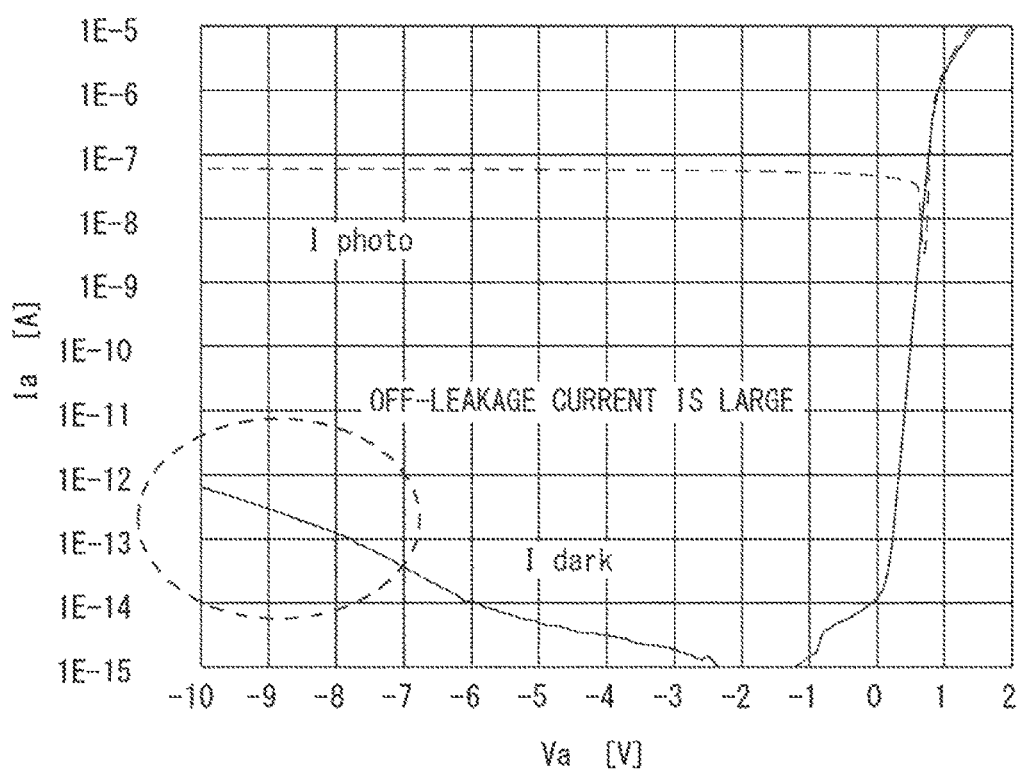
FIG. 9 is a graph illustrating an example property of the photodiode in accordance with the conventional technique.

FIG. 4 demonstrates that an off-leakage current is reduced, as compared with an example property of a photodiode 9 in accordance with the conventional technique (see FIG. 8).

[Effect of Embodiment 1]

With the above configuration, it is possible to reduce the off-leakage current of the photodiode 9, by securing the void 22 such that there is not provided any photodiode 9 directly above the contact hole 21.

Furthermore, it is possible to secure a fill factor (i.e., an index that represents performance of a photodiode) of the photodiode 9, by securing the contact hole 21 directly below the source electrode 13 in a case where the source electrode 13 is provided above the photodiode 9. In other words, the source electrode 13, which blocks light, is provided directly above the contact hole 21 in which there is not provided any photoelectric conversion layer. This causes the photoelectric conversion layer to be easily irradiated with light, and this ultimately allows an improvement in efficiency.

Moreover, it is possible to reduce a parasitic capacitance between the source electrode 4 and the source electrode 13, by securing the contact hole 21 and the source electrode 13 in the center of the adjacent source electrodes 4.

Embodiment 2

Embodiment 2 of the present invention will be discussed below with reference to FIG. 5. For convenience, members having the same functions as those explained in Embodiment 1 are given the same reference signs, and their explanations are omitted.

Figure 5:
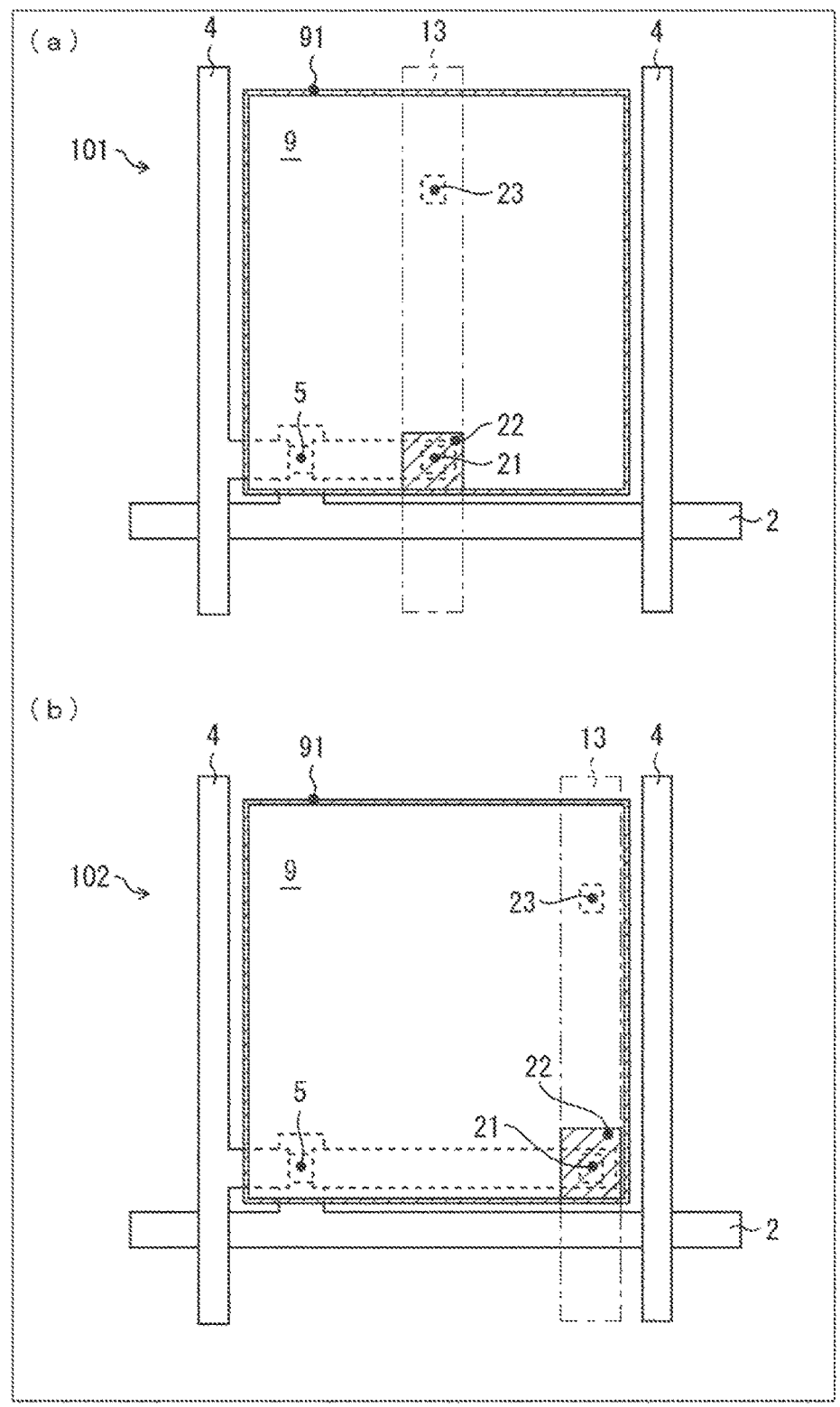
FIG. 5 is a plan view illustrating a configuration of an array substrate for use in a photoelectric conversion device in accordance with Embodiment 2 of the present invention.

(a) of FIG. 5 is a plan view illustrating a configuration of an array substrate for use in a photoelectric conversion device 101 in accordance with Embodiment 2. In the photoelectric conversion device 101, a contact hole 21 is secured in a circumferential part of a photodiode 9 (see (a) of FIG. 5).

(b) of FIG. 5 is a plan view illustrating a configuration of an array substrate for use in a photoelectric conversion device 102 in accordance with Embodiment 2. In the photoelectric conversion device 101, there is secured a contact hole 21 at a corner part of a photodiode 9 (see (b) of FIG. 5).

Embodiment 3

Embodiment 3 of the present invention will be discussed below with reference to FIG. 6. For convenience, members having the same functions as those explained in Embodiments 1 and 2 are given the same reference signs, and their explanations are omitted.

Figure 6:
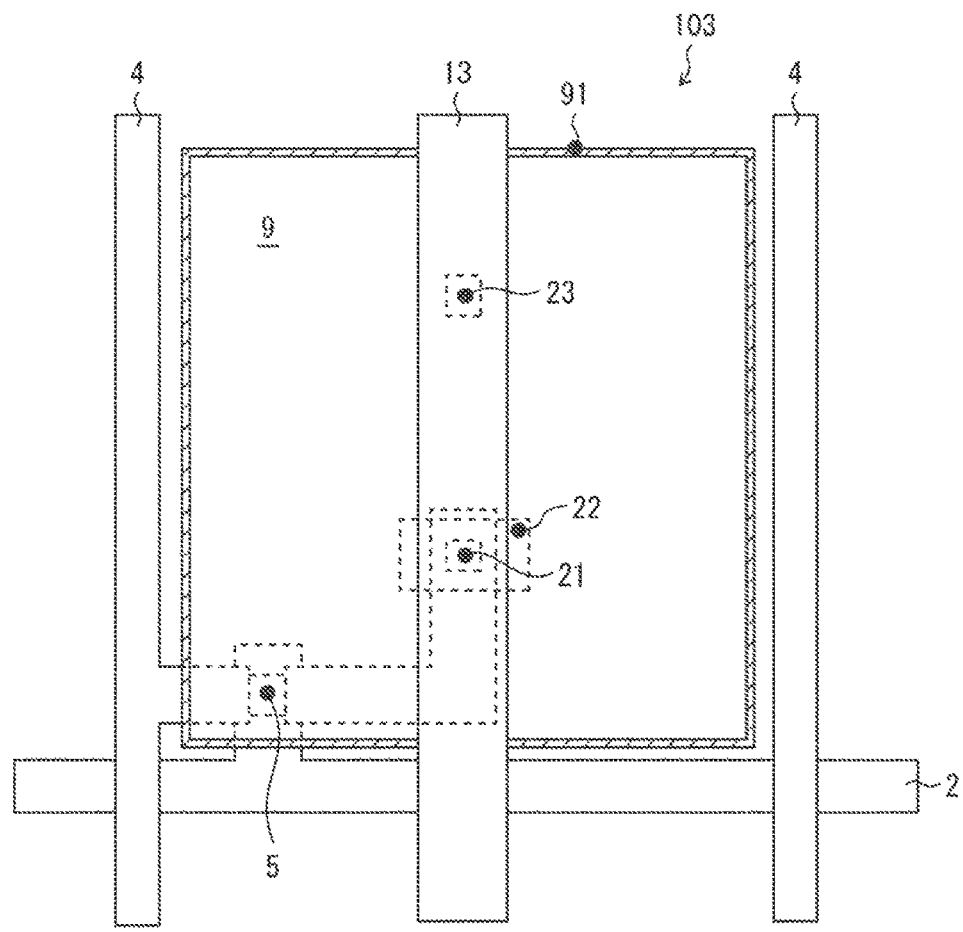
FIG. 6 is a plan view illustrating a configuration of an array substrate for use in a photoelectric conversion device in accordance with Embodiment 3 of the present invention.
Figure 7:
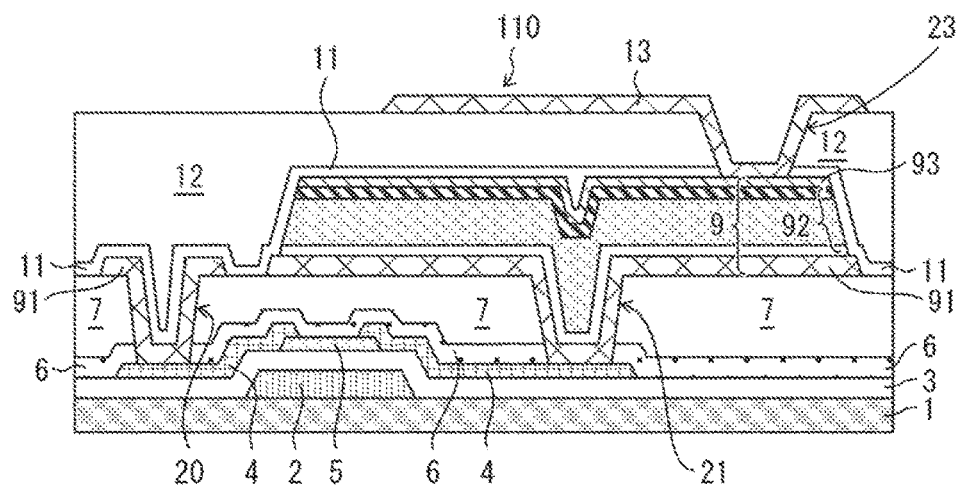
FIG. 7 is a sectional view illustrating an example of a photoelectric conversion device in accordance with conventional technique.

FIG. 6 is a plan view illustrating a configuration of an array substrate for use in a photoelectric conversion device 103 in accordance with Embodiment 3. When the photoelectric conversion device 103 is viewed from above, a void 22 secured above a contact hole 21 protrudes from a source electrode 13. Such a configuration can also bring about an effect of increasing an area of a photoelectric conversion layer 92 which area is to be irradiated with light (not illustrated FIG. 6, see FIG. 2), provided that the void 22 secured above the contact hole 21 partially overlaps with the source electrode 13.

[Recap]

A photoelectric conversion device 100 in accordance with a first aspect of the present invention includes: a substrate 1; a thin film transistor (oxide semiconductor layer 5) provided on the substrate 1, a first insulating layer (passivation film 6 and planarizing film 7) stacked on the thin film transistor; and a photodiode 9 including an upper electrode 93, a lower electrode 91, and a photoelectric conversion layer 92 which is provided between the upper electrode 93 and the lower electrode 91, the lower electrode of the photodiode being connected to a drain electrode (source electrode 4) of the thin film transistor, via a first contact hole (contact hole 21) secured in the first insulating layer, no photoelectric conversion layer being provided directly above the first contact hole.

With the above configuration, it is possible to reduce an off-leakage current of a photodiode in a photoelectric conversion device.

The photoelectric conversion device in accordance with a second aspect of the present invention can be configured such that, in the first aspect of the present invention, a source electrode (13) of the photodiode is provided directly above the first contact hole.

According to the above configuration, the source electrode, which blocks light, is provided directly above the first contact hole in which there is not provided any photoelectric conversion layer. This causes the photoelectric conversion layer to be easily irradiated with light, and this ultimately allows an improvement in efficiency of arrangement.

The photoelectric conversion device in accordance with a third aspect of the present invention can be configured such that, in the second aspect of the present invention, the first contact hole and the source electrode of the photodiode are provided in a center of adjacent drain electrodes of the thin film transistor.

The above configuration allows a reduction in parasitic capacitance between the drain electrode of the thin film transistor and the source electrode of the photodiode.

The present invention is not limited to the embodiments, but can be altered by a skilled person in the art within the scope of the claims. The present invention also encompasses, in its technical scope, any embodiment derived by combining technical means disclosed in differi g embodiments. Further, it is possible to form a new technical feature by combining the technical means disclosed in the respective embodiments.

REFERENCE SIGNS LIST

1: Substrate
2: Gate electrode
3: Gate insulating film
4: Source electrode (drain electrode)
5: Oxide semiconductor layer (thin film transistor)
6: Passivation film (first insulating layer)
7: Planarizing film (first insulating layer)
9: Photodiode
11: SiNx insulating film (second insulating layer)
12: Planarizing film (second insulating layer)
13: Source electrode
21: Contact hole (first contact hole)
22: Void
23: Contact hole (second contact hole)
91: Lower electrode
92: Photoelectric conversion layer
921: n+ layer
922: i layer
93: Upper electrode

The invention claimed is:

1. A photoelectric conversion device, comprising:
a substrate;
a thin film transistor provided on the substrate, the thin film transistor including a drain electrode and a source electrode;
a plurality of source electrode lines each connected to the source electrode of the thin film transistor and extending in a first direction;
a first insulating layer stacked on the thin film transistor;
a photodiode including an upper electrode, a lower electrode, and a photoelectric conversion layer which is provided between the upper electrode and the lower electrode; and
a second insulating layer stacked on the photodiode,
the lower electrode of the photodiode being connected to the drain electrode of the thin film transistor, via a first contact hole secured in the first insulating layer,
a source electrode of the photodiode being connected to the upper electrode of the photodiode, via a second contact hole secured in the second insulating layer,
no photoelectric conversion layer being provided directly above the first contact hole,
no source electrode of the photodiode being provided directly above the thin film transistor.

2. The photoelectric conversion device as set forth in claim 1, wherein:
the source electrode of the photodiode is provided directly above the first contact hole;
the first contact hole is provided midway between two adjacent ones of the plurality of source electrode lines; and
the source electrode of the photodiode are provided only in a position midway between two adjacent ones of the plurality of source electrode lines.

3. The photoelectric conversion device as set forth in claim 1, wherein:
a line width of the source electrode of the photodiode is constant.

4. The photoelectric conversion device as set forth in claim 1, wherein:
an imaginary straight line connecting the first contact hole and the second contact hole is parallel to the first direction.

* * * * *